(12) United States Patent
Ganesan et al.

(10) Patent No.: US 10,170,409 B2
(45) Date of Patent: Jan. 1, 2019

(54) PACKAGE ON PACKAGE ARCHITECTURE AND METHOD FOR MAKING

(71) Applicants: Sanka Ganesan, Chandler, AZ (US);
John S. Guzek, Chandler, AZ (US);
Nitesh Nimkar, Chandler, AZ (US);
Klaus Reingruber, Langquaid (DE);
Thorsten Meyer, Regensburg (DE)

(72) Inventors: Sanka Ganesan, Chandler, AZ (US);
John S. Guzek, Chandler, AZ (US);
Nitesh Nimkar, Chandler, AZ (US);
Klaus Reingruber, Langquaid (DE);
Thorsten Meyer, Regensburg (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/037,276

(22) PCT Filed: Dec. 23, 2013

(86) PCT No.: PCT/US2013/077601
§ 371 (c)(1),
(2) Date: May 17, 2016

(87) PCT Pub. No.: WO2015/099684
PCT Pub. Date: Jul. 2, 2015

(65) Prior Publication Data
US 2016/0284642 A1    Sep. 29, 2016

(51) Int. Cl.
*H01L 23/02* (2006.01)
*H01L 23/52* (2006.01)
(Continued)

(52) U.S. Cl.
CPC ........ *H01L 23/5226* (2013.01); *H01L 21/565* (2013.01); *H01L 21/76877* (2013.01);
(Continued)

(58) Field of Classification Search
None
See application file for complete search history.

(56) References Cited

U.S. PATENT DOCUMENTS

| | | | |
|---|---|---|---|
| 5,790,384 A | 8/1998 | Ahmad et al. | |
| 2002/0017738 A1* | 2/2002 | Miyajima | B29C 45/14655 264/272.17 |

(Continued)

FOREIGN PATENT DOCUMENTS

| | | |
|---|---|---|
| JP | 2004235523 A | 8/2004 |
| JP | 2012015546 A | 1/2012 |
| JP | 2012129263 A | 7/2012 |

OTHER PUBLICATIONS

International Search Report and Written Opinion dated Sep. 23, 2014 for International Application No. PCT/US2013/077601, 10 pages.

(Continued)

*Primary Examiner* — Sitaramarao S Yechuri
(74) *Attorney, Agent, or Firm* — Schwabe, Williamson & Wyatt, P.C.

(57) ABSTRACT

Embodiments of the present disclosure are directed to package assemblies and methods for fabricating package assemblies. In one embodiment, a package assembly includes a die at least partially embedded in a mold compound; and a through mold via (TMV). The TMV may have vertical sides or may include two different portions with varying shapes. In some instances, prefabricated via bars may be used during fabrication. Package assemblies of the present disclosure may include package-on-package (POP) interconnects having a pitch of less than 0.3 mm. Other embodiments may be described and/or claimed.

20 Claims, 12 Drawing Sheets

(51) Int. Cl.
*H01L 23/522* (2006.01)
*H01L 21/56* (2006.01)
*H01L 21/768* (2006.01)
*H01L 23/498* (2006.01)
*H01L 23/00* (2006.01)
*H01L 25/065* (2006.01)
*H01L 25/10* (2006.01)
*H01L 25/00* (2006.01)
*H01L 23/31* (2006.01)
*H01L 23/538* (2006.01)

(52) U.S. Cl.
CPC .. *H01L 23/49811* (2013.01); *H01L 23/49827* (2013.01); *H01L 24/19* (2013.01); *H01L 24/96* (2013.01); *H01L 25/0655* (2013.01); *H01L 25/105* (2013.01); *H01L 25/50* (2013.01); H01L 21/568 (2013.01); H01L 23/3128 (2013.01); H01L 23/3171 (2013.01); H01L 23/5389 (2013.01); H01L 2224/12105 (2013.01); H01L 2224/16225 (2013.01); H01L 2225/06548 (2013.01); H01L 2225/1035 (2013.01); H01L 2225/1088 (2013.01); H01L 2924/15311 (2013.01); H01L 2924/181 (2013.01); H01L 2924/19105 (2013.01); H01L 2924/3511 (2013.01)

(56) References Cited

U.S. PATENT DOCUMENTS

| | | | |
|---|---|---|---|
| 2004/0070064 A1* | 4/2004 | Yamane | H01L 23/3114 257/686 |
| 2004/0183192 A1* | 9/2004 | Otsuka | H01L 23/5384 257/734 |
| 2006/0043573 A1* | 3/2006 | Hedler | H01L 21/568 257/700 |
| 2007/0132112 A1* | 6/2007 | Ozaki | H01L 21/565 257/787 |
| 2007/0231956 A1* | 10/2007 | Fukaya | B29C 45/1753 438/106 |
| 2008/0017968 A1* | 1/2008 | Choi | H01L 21/565 257/686 |
| 2008/0308950 A1 | 12/2008 | Yoo et al. | |
| 2009/0020882 A1* | 1/2009 | Hasegawa | H01L 21/481 257/773 |
| 2009/0057916 A1* | 3/2009 | Yeom | H01L 24/49 257/777 |
| 2009/0289339 A1* | 11/2009 | Hu | H01L 21/561 257/678 |
| 2010/0200890 A1* | 8/2010 | Tomiyama | C08G 18/4202 257/100 |
| 2010/0327419 A1 | 12/2010 | Muthukumar et al. | |
| 2011/0001245 A1 | 1/2011 | Jobetto | |
| 2011/0033986 A1* | 2/2011 | Shikano | H01L 24/49 438/124 |
| 2011/0068481 A1* | 3/2011 | Park | H01L 23/3128 257/777 |
| 2011/0241193 A1* | 10/2011 | Ding | H01L 21/568 257/686 |
| 2011/0241218 A1 | 10/2011 | Meyer et al. | |
| 2011/0278736 A1 | 11/2011 | Lin et al. | |
| 2011/0291106 A1* | 12/2011 | Kikuchi | H01L 23/3107 257/777 |
| 2012/0001339 A1 | 1/2012 | Malatkar | |
| 2012/0013000 A1* | 1/2012 | Haba | H01L 21/565 257/737 |
| 2012/0119373 A1* | 5/2012 | Hunt | H01L 21/565 257/774 |
| 2012/0273960 A1 | 11/2012 | Park et al. | |
| 2012/0306097 A1* | 12/2012 | Kim | H01L 24/97 257/774 |
| 2012/0326289 A1* | 12/2012 | Minamio | H01L 21/565 257/676 |
| 2013/0049198 A1* | 2/2013 | Liao | H01L 21/78 257/738 |
| 2013/0105991 A1 | 5/2013 | Gan et al. | |
| 2013/0119549 A1* | 5/2013 | Cheng | B29C 39/10 257/772 |
| 2013/0168858 A1 | 7/2013 | Ramasamy et al. | |
| 2013/0200528 A1 | 8/2013 | Lin et al. | |
| 2014/0264801 A1* | 9/2014 | Minamio | H01L 23/4334 257/675 |

OTHER PUBLICATIONS

Office Action dated May 30, 2017 for Japanese Patent Application No. 2016-532524, 10 pages.
Search Report dated Jul. 7, 2017 for European Patent Application No. 13900410.5, 14 pages.
Office Action dated Aug. 31, 2017 for Korean Patent Application No. 2016-7013341, 19 pages.
Search Report dated Nov. 9, 2017 for European Patent Application No. 13900410.5, 14 pages.
Final Rejection dated May 8, 2018 for Korean Patent Application No. 2016-7013341, 8 pages.

\* cited by examiner

PACKAGE ON PACKAGE ARCHITECTURE AND METHOD FOR MAKING

CROSS REFERENCE TO RELATED APPLICATIONS

The present application is a national phase entry under 35 U.S.C. § 371 of International Application No. PCT/US2013/077601, filed Dec. 23, 2013, entitled "PACKAGE ON PACKAGE ARCHITECTURE AND METHOD FOR MAKING", which designated, among the various States, the United States of America. The Specification of the PCT/US2013/077601 Application is hereby incorporated by reference.

FIELD

Embodiments of the present disclosure generally relate to the field of integrated circuits, and more particularly, a package-on-package (POP) architecture including package assemblies with through mold vias (TMVs) as well as methods for fabricating such package assemblies.

BACKGROUND

Emerging package assemblies may utilize POP architectures allowing a package assembly to be mounted on another package assembly. These POP architectures may require that a first package assembly be electrically coupled to a second package assembly and/or electrically coupled to a package substrate. In some instances, TMVs or other package-level interconnects, formed in the second package may be utilized to electrically couple the first package assembly to other components. The fabrication and structure of these TMVs, or other package-level interconnects, may dictate a minimum achievable pitch for package-level interconnects or POP interconnect structures.

BRIEF DESCRIPTION OF THE DRAWINGS

Embodiments will be readily understood by the following detailed description in conjunction with the accompanying drawings. To facilitate this description, like reference numerals designate like structural elements.

Embodiments are illustrated by way of example and not by way of limitation in the figures of the accompanying drawings.

DETAILED DESCRIPTION

Figure 1A:
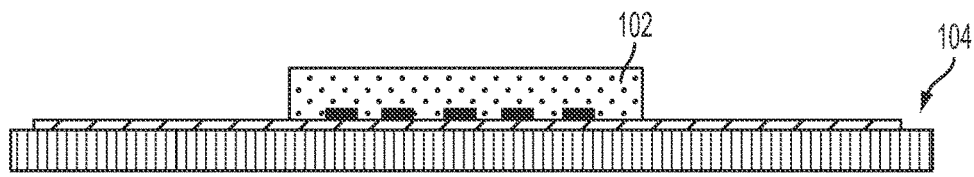
FIGS. 1A-J schematically illustrate cross-section side views of a package assembly during various stages of fabrication, in accordance with some embodiments.

Embodiments of the present disclosure describe POP architectures and package assemblies including POP interconnects, and methods of fabricating packaging assemblies. These embodiments may facilitate fabrication of the POP interconnects and TMVs, with smaller pitches.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIGS. 1A-J illustrate operations for forming a package assembly including a TMV according to existing fabrication techniques. The present disclosure describes a number of techniques to modify the existing fabrication process to simplify fabrication and/or to provide smaller pitch POP interconnects. Smaller pitch POP interconnects may facilitate smaller package sizes and/or increased memory bandwidth.

As illustrated in FIG. 1A a die 102 may be placed on a mold carrier 104. The die 102 may contain active or passive elements. Die 102 may include one or more processors, logic dies, memory or other devices. The die 102 may be placed by a pick and place operation or any other suitable technique. Adhesives may be used to secure the die 102 in place on the mold carrier 104. Although one die is shown, any number of dies may be included and attached at this stage. While a single package assembly is illustrated, the fabrication process may include forming a plurality of the package assemblies simultaneously. As such, the mold carrier 104 may be large, providing a base for numerous package assemblies. When more than one package assembly is fabricated simultaneously it may be necessary to later separate the plurality of package assemblies from one another to provide individual package assemblies. The mold carrier 104 is shown as having two layers, but may have fewer layers or more layers. In some embodiments the mold carrier may include a carrier portion and an adhesive that facilitates the release of the carrier from package assembly after the molding processing is complete.

Figure 1B:
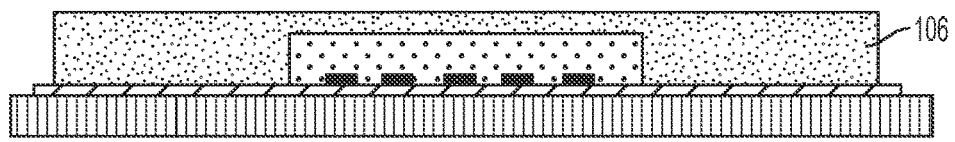

As illustrated in FIG. 1B a mold compound 106 may be added to at least partially encapsulate the die 102. The mold compound 106 may be added via a compression molding process or any other suitable molding process.

Figure 1C:

As shown in FIG. 1C the mold carrier may be debonded leaving the die 102 partially encapsulated in the mold compound 106. The bottom surface of the die 102 may be exposed (not covered by mold compound 106) at this point.

Figure 1D:

As shown in FIG. 1D a dielectric layer 108 may be applied to the bottom of the mold compound 106 as well as the exposed portion of the die 102. A patterning or etching process as well as laser exposure or drilling may be used to create openings 124 in the dielectric layer 108. While the package assembly is shown in a particular orientation for clarity, it may be advantageous to change the orientation of the package assembly during fabrication to facilitate access to the certain portions of the package assembly and/or to take advantage of gravitational effects on retention and placement operations. Any references to the orientation of the package assembly (e.g., top, bottom, overlying, underlying etc.) are for explanatory purposes only and should not be considered to limit the package assembly to any particular orientation or configuration.

Figure 1E:
Figure 1F:

As shown in FIG. 1E a conductive material 110 may be applied onto the dielectric layer 108. The conductive material 110 may be a redistribution layer (RDL) to route electrical signals from contacts on the die 102 to POP interconnects, such as ball grid array (BGA) 114. While a single RDL may be used, as seen in FIGS. 1E-F, it may also be possible to include multiple RDLs as seen in FIGS. 1G-1J. The conductive material 110 may be applied by any suitable technique and may include multiple operations, for instance applying the conductive material may include sputtering a metal layer, applying and patterning a resist layer, and then plating a conductive material onto areas where the sputtered metal is exposed.

As shown in FIG. 1F a solder stop 112 may be applied and a BGA 114 may be added to provide package-level interconnects. While a BGA is shown any type of package-level interconnects may be used including pads or other suitable structures.

Figure 1G:
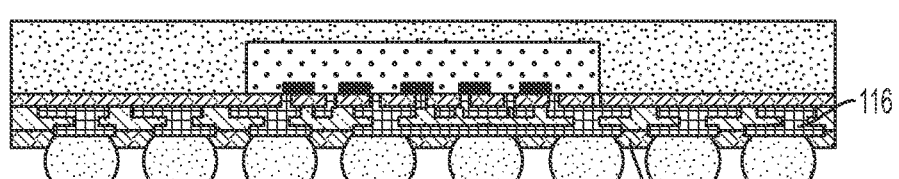

As shown in FIG. 1G multiple RDLs 116 may be formed prior to application of the solder stop 112 and the BGA 114, or other package-level interconnects. FIG. 1G is an alternative to FIG. 1F and although subsequent operations are shown with the multiple RDL configuration consistent with FIG. 1G, these subsequent operations may readily be applied to the single RDL configuration shown in FIG. 1F.

Figure 1H:
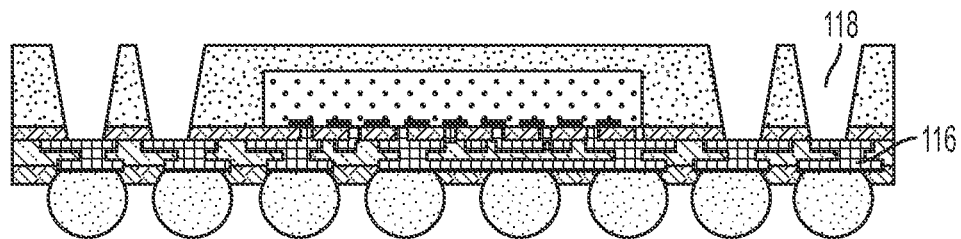

As shown in FIG. 1H TMVs 118 may be formed by removing material from the upper side of mold compound 106 to expose an RDL 116 (or RDL 110 in the configuration of FIG. 1F). This may be accomplished by any suitable operation, and may include a drilling operation e.g., laser drilling. After the TMVs 118 have been created, they may be cleaned to facilitate additional processing. The cleaning may include any suitable operations and may include for instance a wet etch, a plasma etch, or a combination thereof.

Figure 1I:
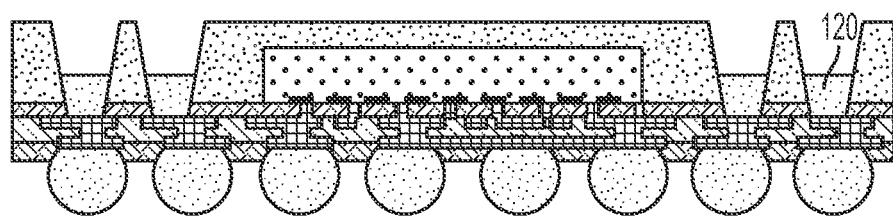

As shown in FIG. 1I solder 120 may be added to the TMVs 118. This may be accomplished by any suitable operation and may include the application of solder paste or a solder ball with flux. This may also include a reflow operation to ensure adequate electrical contact between the solder 120 and the RDL 116.

Figure 1J:
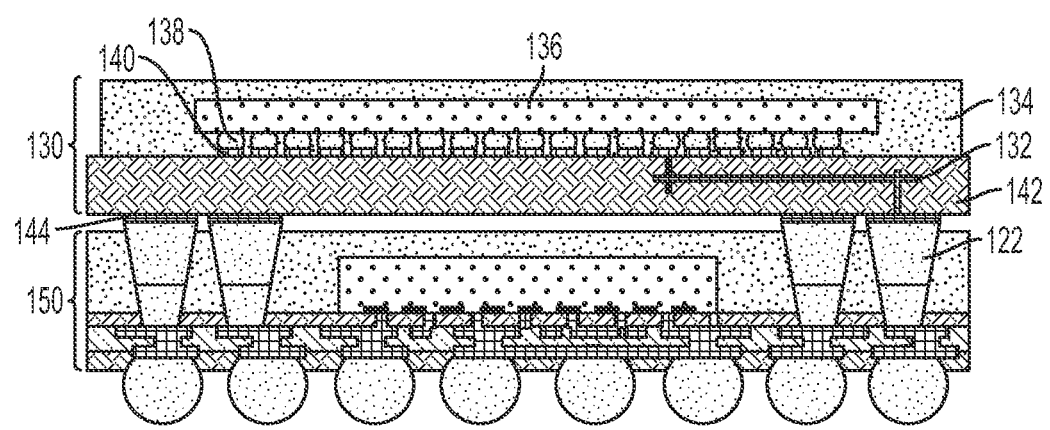

As shown in FIG. 1J additional solder material may be added to the TMVs 118 to create POP interconnects (upper surface of 122). This may result in a package assembly 150 with package-level interconnects on both sides (shown as BGA on lower surface and POP pads on upper surface) that may facilitate the addition of an additional package assembly, such as package assembly 130, in a POP arrangement. Although shown as two separate depositions of solder or other conductive material in conjunction with FIGS. 1I and 1J it may also be possible to form the TMV and POP interconnect in a single operation that substantially fills the TMV 118 and forms the POP interconnect through a single deposition of material.

The additional package assembly 130 may include a die 136. The die 136 may include active or passive elements. In one configuration die 102 may contain a processor while die 136 may contain primarily memory. Die 136 may be coupled to a substrate 142 by die-level interconnects 138. Die 136 may be at least partially encapsulated in a mold compound 134. Die-level interconnects 138 may be a BGA as shown or any other suitable interconnect structure. Interconnect pads 140 may be present on substrate 142 for electrically coupling die-level interconnects 138 to substrate electrically routing such as 132. Although only a single substrate electrically routing 132 is shown, a plurality of such routing may be included to electrically couple die 136 to package-level interconnects such as pads 144. Although shown as either pads or BGAs, any suitable structure may be used for any package-level or die-level interconnects. Solder, such as solder 120 and 122, located in TMVs 118 may electrically couple die 136 to die 102 and/or package-level interconnects such as BGA 114.

Figure 2:
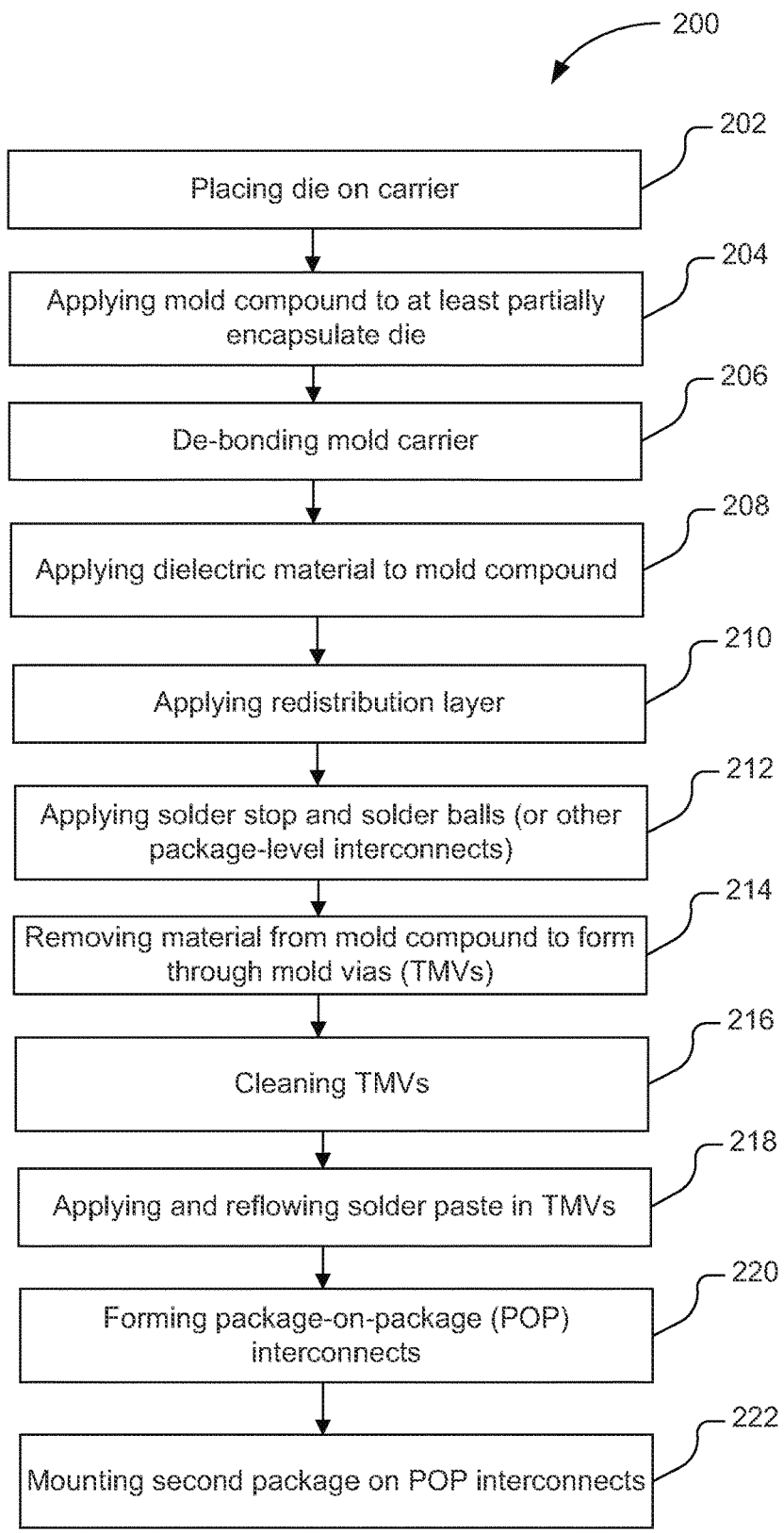
FIG. 2 schematically illustrates a flow diagram of a method of fabricating a package assembly, in accordance with some embodiments.

FIG. 2 schematically illustrates a flow diagram of a method 200 of fabricating a package assembly consistent with the operations discussed above relative to FIGS. 1A-J.

At 202 the method 200 may include placing one or more dies on a mold carrier as discussed previously regarding FIG. 1A. Any suitable techniques may be used to carry out this operation, including a pick and place operation as discussed previously.

At 204 the method 200 may include applying a mold compound to at least partially encapsulate the die, as discussed previously regarding FIG. 1B. Any suitable techniques may be used to carry out this operation, including a compression molding operation as discussed previously.

At 206 the method 200 may include debonding the mold carrier from the mold compound as discussed previously regarding FIG. 1C. Any suitable techniques may be used to carry out this operation.

At 208 the method 200 may include applying a dielectric material to the mold compound as discussed previously regarding FIG. 1D. Any suitable techniques may be used to carry out this operation, including patterning or etching operations as discussed previously.

At 210 the method 200 may include forming one or more RDLs as discussed previously regarding FIG. 1E (multiple RDLs discussed regarding FIG. 1G). Any suitable techniques may be used to carry out this operation, including multiple operations such as sputtering, patterning and plating as discussed previously.

At 212 the method 200 may include applying solder stops and package-level interconnects (e.g., BGA 114) as discussed previously regarding FIG. 1F. Any suitable techniques may be used to carry out this operation.

At 214 the method 200 may include removing material from the mold compound to form TMVs as discussed previous regarding FIG. 1H. Any suitable techniques may be used to carry out this operation, including laser drilling as discussed previously.

At 216 the method 200 may include cleaning the TMVs as discussed previously regarding FIG. 1H. Any suitable techniques may be used to carry out this operation, including wet etching, plasma etching, or a combination thereof as discussed previously.

At 218 the method 200 may include applying solder paste or solder balls and flux to the TMVs as discussed previously regarding FIG. 1J. This operation may also include a reflow operation to ensure adequate electrical contact between the solder and the RDL. Any suitable techniques may be used to carry out this operation.

At 220 the method 200 may include forming POP interconnects as discussed previously regarding FIG. 1J. The POP interconnects may be any suitable structure including pads or BGA balls. Any suitable techniques may be used to carry out this operation, including the addition of solder balls or pads as discussed previously.

At 222 the method 200 may include mounting a second package assembly on POP interconnects of the first package assembly as discussed previously regarding FIG. 1J. Any suitable techniques and structures may be used to carry out this operation.

Various operations are described as multiple discrete operations in turn, in a manner that is most helpful in understanding the claimed subject matter. However, the order of description should not be construed as to imply that these operations are necessarily order dependent.

Creation of TMVs by the techniques discussed relative to FIGS. 1A-J present certain challenges. First, the RDL may be the stop layer for a laser drilling process to form TMVs 118. This may result in some loss of RDL material due to the laser drilling process. Second, due to the depth of the TMV and the limited thickness of the RDL it may not be possible to perform an etch (such as a copper etch) of the RDL for fear of removing too much material. This may complicate the cleaning process to prepare the TMV surfaces for subsequent processing operations. Proper surface preparation may be necessary to ensure the different conductive materials make proper contact and provide a reliable electrical pathway. Finally, additional processing operations, such as the addition of solder to the TMV as well as other elevated temperature processes, may further consume portions of the RDL increasing the possibility of unreliable electrical pathways. Providing a thicker RDL as well as minimizing the depth of the laser drilling may minimize or eliminate these concerns. Additionally, the presence of a thicker RDL below the TMV and/or a decreased TMV depth may allow for other cleaning operations to be utilized, such as a direct copper etch, potentially providing a more reliable and/or simpler fabrication process.

Figure 3A:
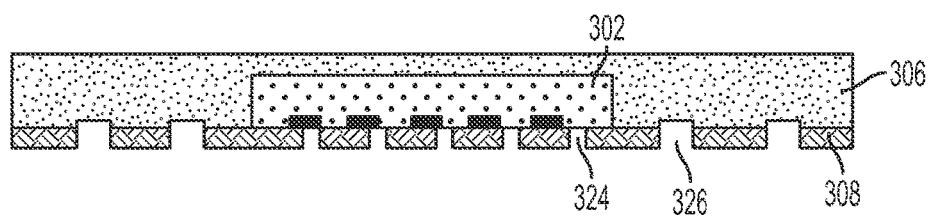
FIGS. 3A-B schematically illustrate cross-section side views of a package assembly during various stages of fabrication including TMV stops, in accordance with some embodiments.
Figure 3B:
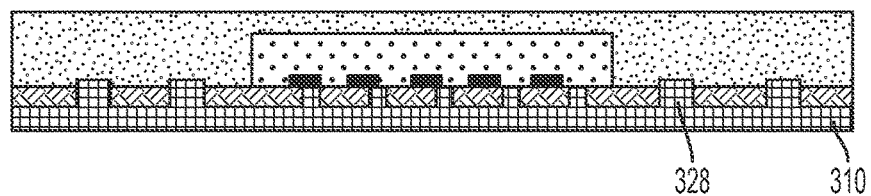

FIGS. 3A-B illustrate a technique for providing a localized thicker RDL in areas where TMVs are to be formed in accordance with some embodiments. A localized thicker RDL may be desirable as it may provide additional material in the desired regions without additional challenges associated with a universally thicker RDL, such as warpage and cost increases due to added material.

FIG. 3A is an alternative to FIG. 1D discussed previously. A package assembly may include a die 302 at least partially encapsulated in a mold compound 306. Die 302 and mold compound 306 may be similar to die 102 and mold compound 106 discussed previously with reference to FIG. 1. Unlike FIG. 1, in FIG. 3A additional cavities 326 are formed in the mold compound 306 and the dielectric layer 308. The cavities 326 are formed outside of an area defined by the shadow of the die 302 (area directly below the die 302 in FIG. 3A, sometimes referred to as a fan-out area). The cavities may be formed in a particular arrangement that corresponds to locations where TMVs will be formed. Cavities 326 may be formed by any suitable technique. The same operations use to create gaps 324 exposing the contacts of die 302 may be used to form cavities 326. It may also be possible to form the portion of the cavities 326 that extend into the mold compound 306 prior to, or during, the molding process.

As shown in FIG. 3B, application of a conductive material 310 may fill the cavities 326 creating a localized thicker RDL layer 328. Subsequent processing may be carried out in accordance with FIGS. 1-2 to form TMVs and a POP architecture. As discussed above, the localized thicker RDL 328 may facilitate the use of other cleaning operations, such as a copper etch, and may result in more reliable electrical connections between the RDLs and the TMVs as compared to traditional fabrication techniques.

FIGS. 4A-E illustrate a technique for fabricating a TMV in accordance with some embodiments. As shown in FIG.

4A a die 402 may be at least partially encapsulated in a mold compound 406. Die 402 and mold compound 406 may be similar to die 102 and mold compound 106 discussed previously with reference to FIG. 1. The process for partially encapsulating the die 402 in the mold compound 406 may be consistent with the operations discussed previously regarding FIGS. 1A-C and FIG. 2. Die 402 may include contacts 412 which may be part of a metal layer on the die 402. Die 402 may also include a passivation layer 414, such as silicon nitride. The passivation layer 414 may be selectively removed by etching or any other suitable technique to create gaps 410 that expose contacts 412.

Figure 4A:
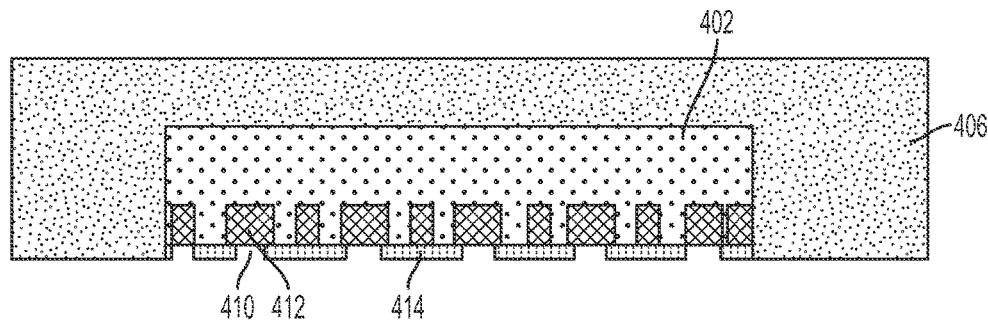
FIGS. 4A-E schematically illustrate cross-section side views of a package assembly during various stages of fabrication including two-stage TMV formation, in accordance with some embodiments.
Figure 4B:
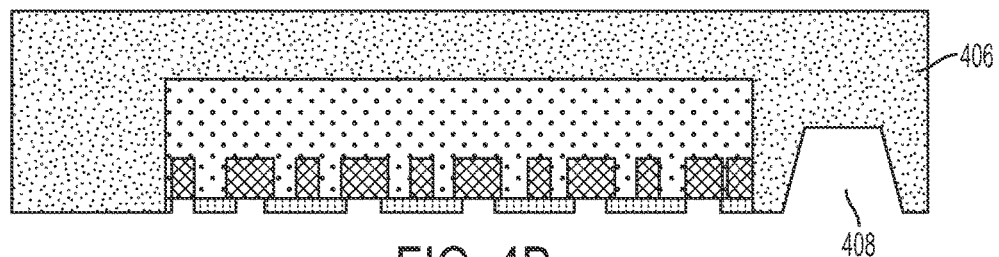

As shown in FIG. 4B part of the mold compound 406 may be removed to form a cavity 408. The cavity 408 may be formed on a lower side of the mold compound 406 where the die 402 is not encapsulated by the mold compound 406. The lower side of the mold compound may include an active side of the die 402. The cavity The cavity 408 may be formed outside of an area defined by the shadow of the die 402 (area directly below the die 402 in FIG. 4A, sometimes referred to as a fan-out area). The cavity 408 may be formed by any suitable technique, including laser drilling. In comparison to FIG. 1, the cavity 408 may be formed between the operations depicted in FIGS. 1C and 1D. The cavity 408 may be formed after the mold carrier has been debonded but before additional layers have been applied to the package. While a single cavity 408 is shown, a plurality of cavities may be formed corresponding to the number and arrangement of TMVs to be formed.

The cavity 408 may also be formed during the molding of the reconstituted wafer, by using a mold carrier with topology or by applying an elevation on the carrier prior to application of the adhesive or adhesive tape on the mold carrier. This can be done by printing, dispensing, jetting, lamination or other suitable techniques. The elevations will produce imprints in the mold compound, which work as cavities 408, as described above.

Figure 4C:
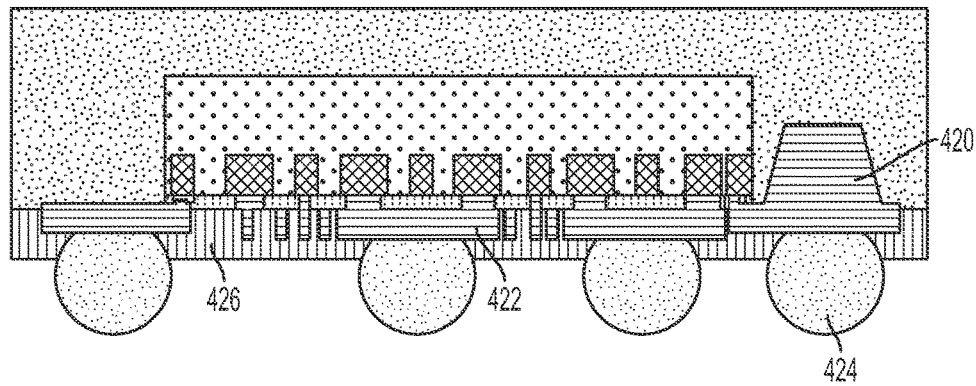

As shown in FIG. 4C cavity 408 may be filled with conductive material 420 to produce a lower portion of a TMV. The conductive material 420 may be deposited as part of an operation that deposits additional conductive material 422 to electrically couple die contacts 412 to package-level interconnects, such as BGA 424, that are formed in a subsequent process. It may also be possible to deposit conductive material 420 into cavity 408 separate from the deposition of other conductive material 422. The lower portion of the TMV may have tapered sides and a conical shape as shown. The lower portion of the TMV may have different shapes depending upon the techniques used to form the cavity 408. In some embodiments, the lower portion of the TMV may have substantially vertical sides and a rectangular or cylindrical shape. Additional operations may be performed to add solder stop 426 and package-level interconnects such as BGA 424. These additional operations may be performed by any suitable technique and may be consistent with the operations discussed previously with reference to FIGS. 1-2.

Figure 4D:
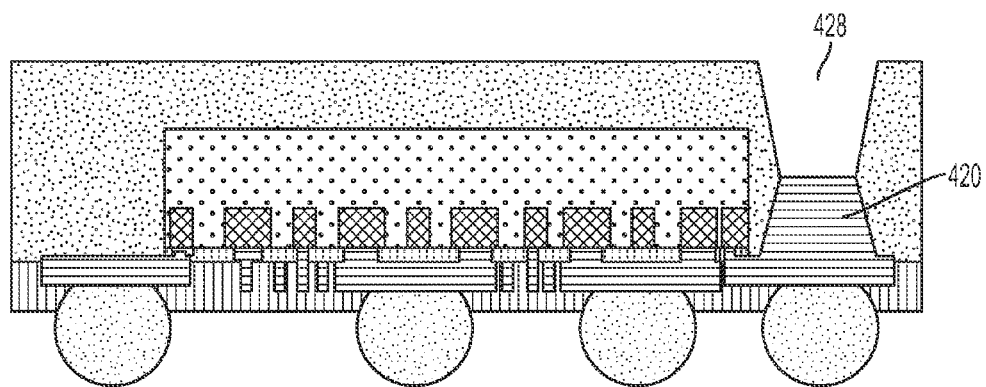

As shown in FIG. 4D a portion of mold compound 406 may be removed to form a cavity 428 exposing a portion of the lower portion of the TMV 420. Cavity 428 may be formed by any suitable technique including laser drilling. A passivation layer or noble metal layer may be applied to 420 in order to stabilize the package assembly for storage prior to installation of an additional POP package. The addition of passivation layer or noble metal layer may provide a package assembly without substantially filling the cavity 428. In such embodiments, cavity 428 may accommodate a POP interconnect structure, such as a BGA ball, protruding from POP package that is to be installed onto the package assembly shown in FIG. 4D.

Figure 4E:
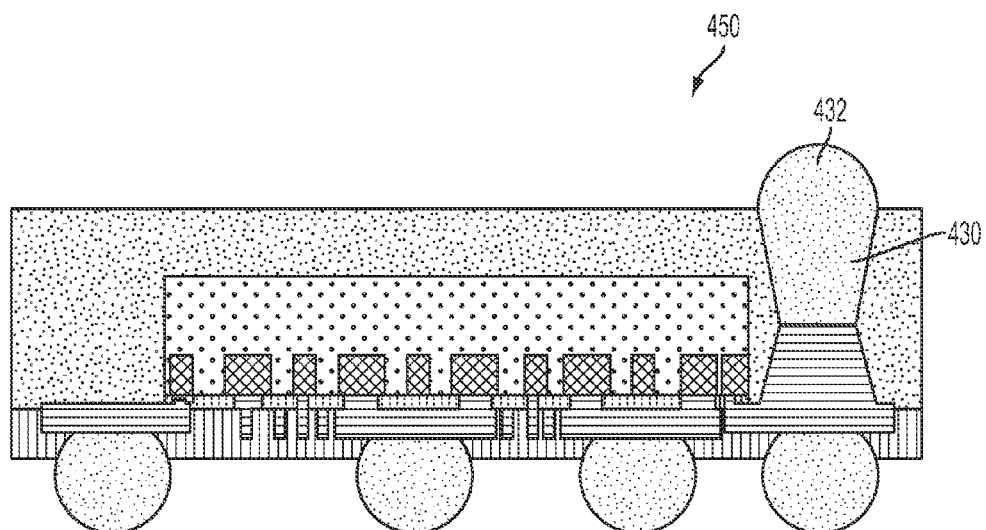

FIG. 4E shows a package assembly 450, or a portion thereof, including a two-stage TMV in accordance with some embodiments. As shown in FIG. 4E conductive material 430, such as solder, may be deposited to fill cavity 428. The process forms the upper portion of the TMV. Additional conductive material, such as BGA ball 432 may be added to conductive material 430 to form POP interconnect. Also, the BGA ball, or other package-level interconnect, of a top package may directly contact conductive material 420, supported by a prior application of flux or small amount of solder paste. While shown as a BGA ball 432, any suitable POP interconnect structure may be used. While a single POP interconnect is shown, the same operations may be performed simultaneously to create an array of POP interconnects. The upper portion of the TMV 430 may have tapered sides and a conical shape as shown. By forming the TMV in two portions the depth of the cavities is minimized. Where laser drilling is utilized this means the depth of a single laser drilling operation is also decreased. This may allow the TMVs to be made smaller than is possible with single one-sided laser drilling operations, such as those discussed in reference to FIG. 1. This may also facilitate the creation of POP interconnects with smaller pitches, including POP interconnects having pitches less than 0.3 mm. Furthermore, the decreased depth of the cavities and additional metal, due to two-stage formation, may facilitate the fabrication process and allow for additional cleaning operations as discussed above relative to FIG. 3.

Figure 5:
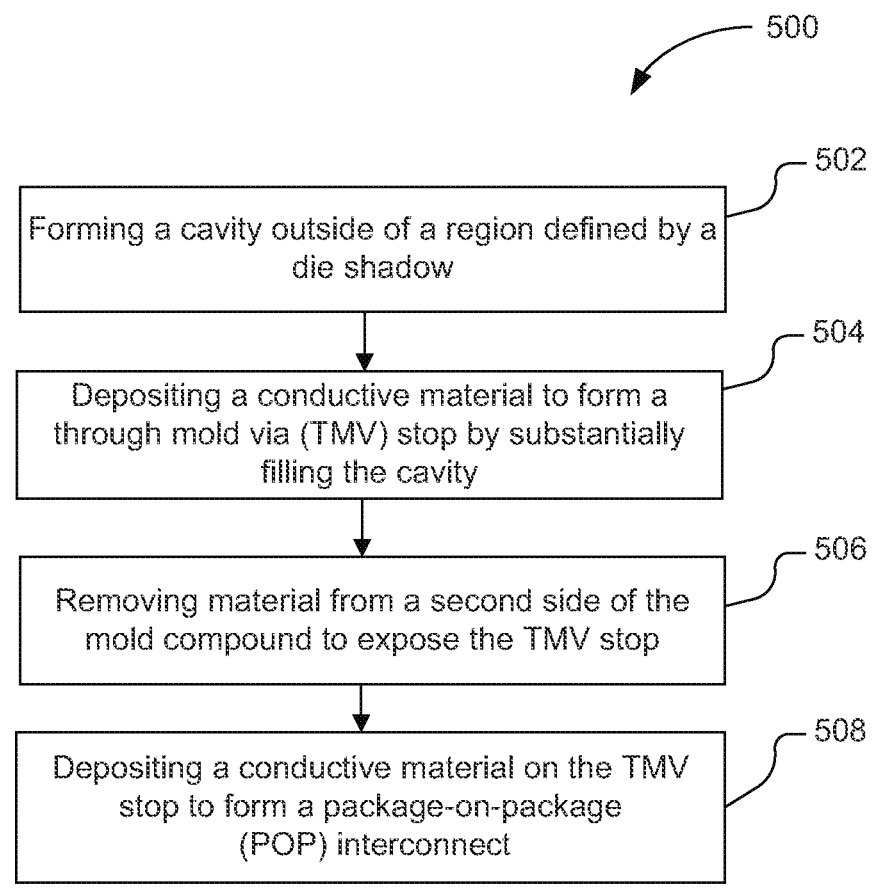
FIG. 5 schematically illustrates a flow diagram of a method of fabricating a package assembly, in accordance with some embodiments.

FIG. 5 schematically illustrates a flow diagram of a method 500 of fabricating a package assembly consistent with the operations discussed above relative to FIGS. 3-4. Only certain operations related to the formation of the TMV are shown, but the method may include additional operations discussed above regarding FIGS. 1-2 to form other structures of the package assembly.

At 502 the method 500 may include forming a cavity outside of a region defined by a die shadow, also known as the fan-out area. This may include forming a cavity such as 326 in FIG. 3A or cavity 408 in FIG. 4B as discussed previously. Any suitable techniques may be used to carry out this operation, including etching, patterning, or laser drilling as discussed previously. As discussed previously this operation may include forming plurality of cavities correspond to an array of TMVs.

At 504 the method 500 may include depositing a conductive material to form a TMV stop by substantially filling the cavity. This may include forming the localized thicker RDL layer 328 of FIG. 3B or the lower portion 420 of the TMV in FIG. 4C. This operation may be performed simultaneously with the deposition of other conductive material and may be performed as part of the deposition of a first metal layer of a package assembly. Any suitable techniques may be used to carry out this operation as discussed previously.

At 506 the method 500 may include removing material from a second side of the mold compound to expose the TMV stop. This may include forming a cavity such as cavity 428 of FIG. 4D. Any suitable technique, including laser drilling, may be used to carry out this operation as discussed previously.

At 508 the method 500 may include depositing a conductive material on the TMV stop to form a POP interconnect. This may include filling a cavity, such as cavity 428 with conductive material. This may further include the addition of a specific POP interconnect structure, such as BGA ball or a pad, onto the deposited conductive material. This operation may also include a reflow operation to ensure adequate electrically coupling between the deposited material and the underlying conductive material. Any suitable techniques may be used to carry out this operation, including the application of solder paste or solder ball and flux as discussed previously. Rather than operation 508 as discussed above, it may be useful to apply a passivation layer or a noble metal layer to the TMV stop. This may stabilize the package assembly for storage prior to installation of an additional POP package. Thus a gap may remain in the mold compound to later accommodate a POP interconnect of an additional package.

Figure 6A:
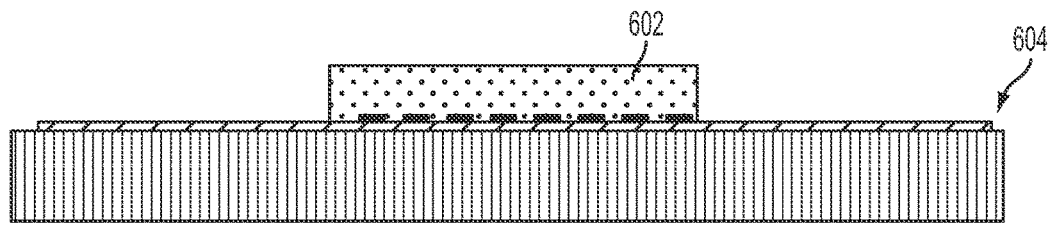
FIGS. 6A-G schematically illustrate cross-section side views of a package assembly during various stages of fabrication including prefabricated via bars, in accordance with some embodiments.
Figure 6B:
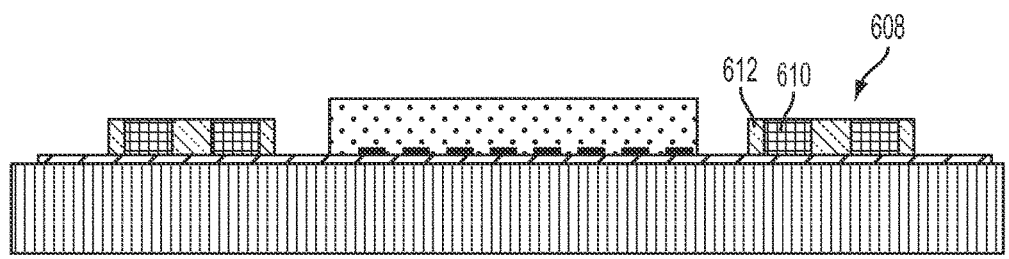

FIGS. 6A-G show another technique for fabricating a TMV in accordance with some embodiments. As shown in FIG. 6A a die 602 may deposited onto a mold carrier 604. This operation may be consistent with that discussed previously relative to FIG. 1A. Die 602 and mold carrier 604 may be similar to those discussed above. Unlike the previous embodiments, a prefabricated via bar 608 may be installed on the mold carrier 604 prior to the application mold compound 614. The prefabricated via bar 608 may include portions of the conductive material 610 separated by portions of a carrier material 612. The prefabricated via bar 608 may include a printed-circuit board (PCB) bar, a through silicon via bar, a ceramic via bar or other suitable structures. The carrier material 612 may include polymer, prepreg material, silicon, ceramic, laminate or other any other suitable material. The conductive material 610 may include copper, tungsten, nickel, solder, a combination thereof, or any other suitable material. The portions of conductive material 610 may have different shapes, including cylindrical or rectangular shapes, such that the sides of the portions of conductive material 610 are substantially vertical when placed on the mold carrier 604. The prefabricated via bars 608 may have a height that is less than, equal to, or greater than a thickness of the die 602. The prefabricated via bars 608 may be placed such that the portions of conductive material 610 are located in positions where TMVs are to be formed. Numerous prefabricated via bars 608 may be placed and may be arranged on either side of die 602 or such that they substantially surround die 602. The prefabricated via bars 608 may extend beyond a single package assembly such that one prefabricated via bar 608 may bridge multiple package assemblies during fabrication. In these embodiments, the prefabricated via bars 608 may later be separated as part of a separation operation in which individual package assemblies may be separated from an array of package assemblies. Any suitable operation, including a pick and place operation, may be used to place the prefabricated via bars 608.

Figure 6C:
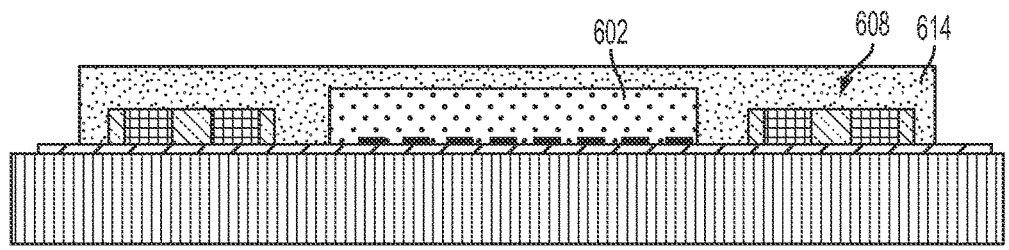

As shown in FIG. 6C a mold compound 614 may be applied to at least partially encapsulate the die 602 as well as the prefabricated via bars 608. This operation may be similar to the operation discussed previously with regard to FIG. 1B, but in this instance the mold compound 614 also at least partially encapsulates the prefabricated via bars 608. Any suitable operation, including a compression molding, pressing or lamination operation, may be used to apply the mold compound 614. The mold compound may be any suitable material including a liquid type, granular type, or sheet type material.

Figure 6D:
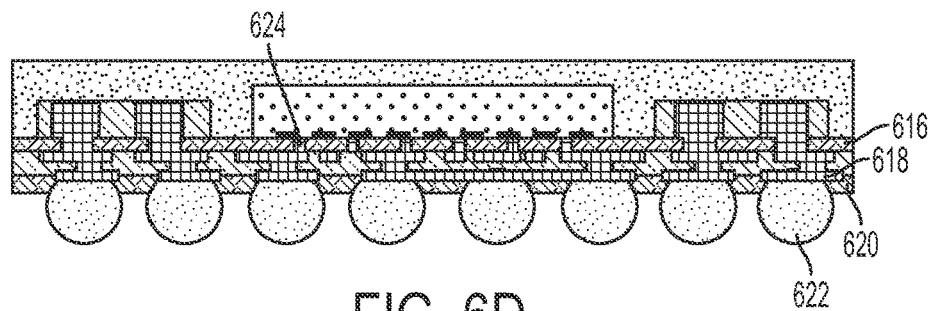

As shown in FIG. 6D additional operations consistent with those discussed above relative to FIGS. 1D-G may be performed to form additional structures of the package assembly. A dielectric layer 616 may be applied similar to dielectric layer 108 in FIG. 1D. Openings, such as 624 may be formed in the dielectric layer 616 to expose die contacts. In addition to exposing die contacts, other opening may be formed to expose a lower surface of conductive material 610 of prefabricated via bar 608. One or more layers of conductive material, such as RDL 618, may be deposited to form electrical pathways to connect die contacts and the conductive material 610 to package-level interconnects, such as BGA balls 622. A solder stop layer 620 may be applied and package-level interconnects, such as BGA balls 622 may be attached. These operations may be consistent with those discussed previously regarding FIG. 1 with the addition that the dielectric layer 616 and conductive material, such as RDLs 618, may be formed to electrically couple package-level interconnects, such as BGA balls 622 to conductive material 610.

Figure 6E:
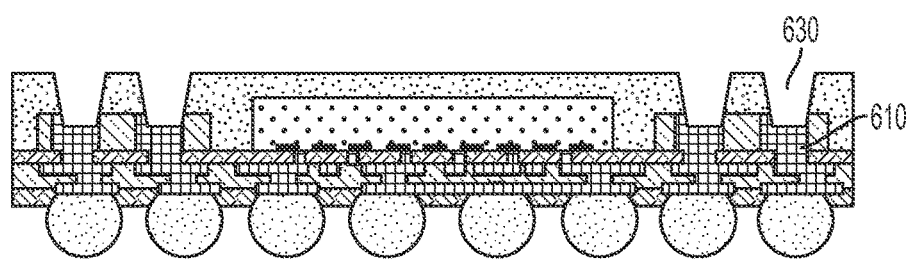

As shown in FIG. 6E material may be removed from mold compound 614 to create cavities 630 and to expose an upper portion of the conductive material 610. As such conductive material 610 may form a lower portion of a TMV. Any suitable technique, including laser drilling, may be used to remove material from the mold compound 614. The cavity 630 may have tapered sides and a conical shape. Various cleaning operations may be performed on the cavity 630 prior to subsequent operations. The decreased depth of the cavity 630, in comparison to FIG. 1H, as well as the increased conductive material due to prefabricated via bar 608 and conductive material 610, may facilitate the cleaning process and allow for a copper etch or other cleaning operations as discussed previously. As discussed previously, a passivation layer or noble metal layer may be applied to exposed portion of conductive material 610 in order to stabilize the package assembly for storage prior to installation of an additional POP package. The addition of passivation layer or noble metal layer may provide a package assembly without substantially filling the cavity 630. In such embodiments, cavity 630 may accommodate a POP interconnect structure, such as a BGA ball, protruding from POP package that is to be installed onto the package assembly shown in FIG. 6E.

Figure 6F:
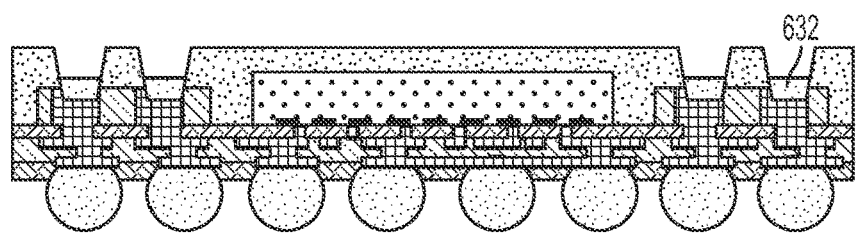

As shown in FIG. 6F conductive material 632 may be deposited into the cavities 630. This may include depositing solder paste or solder balls with flux. This may also include a reflow operation to ensure adequate electrical contact between the conductive material 632 and the conductive material 610.

Figure 6G:
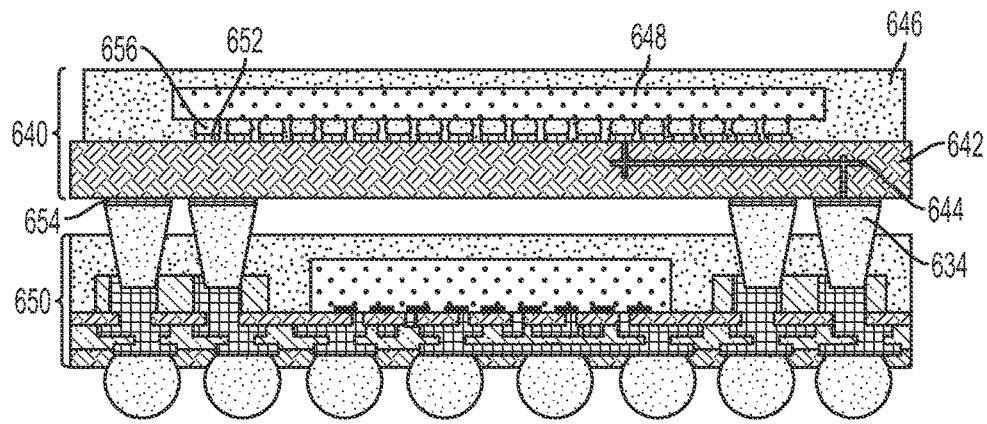

As shown in FIG. 6G additional solder material 634 may be added to the cavities 630 to form the upper portion of TMVs as well as to create POP interconnects (upper surface of 634). This may result in a package assembly 650 with package-level interconnects on both sides (shown as BGA on lower surface and POP pads on upper surface) that may facilitate the addition of an additional package assembly, such as package assembly 640 in a POP arrangement.

The additional package assembly 640 may include a die 648. The die 648 may include active or passive elements. In one configuration die 602 may contain a processor while die 648 may contain primarily memory. Die 648 may be coupled to a substrate 642 by die-level interconnects 656. Die-level interconnects 656 may include Flip Chip bumps or pillars, wire bond or redistribution based interconnects as shown or any other suitable interconnect structure. Interconnect pads 652 may be present on substrate 642 for electrically coupling die-level interconnects 656 to substrate electrical routing such as 644. Although only a single substrate electrically routing 644 is shown, a plurality of such routings may be included to electrically couple die 648 to package-level interconnects such as pads 654. Although shown as either pads or BGAs, any suitable structure may be used for any package-level or die-level interconnects. Solder, such as conductive material 632 and 634, located in cavity 630 may form the upper portion of a TMV and electrically couple die 648 to die 602 and/or package-level interconnects such as BGA balls 622 by way of conductive material 610 and RDLs 618.

The package assembly 650 may contain two-part TMVs including a lower portion made up of conductive material 610 of the prefabricated via bars 608 and an upper portion made up of conductive material 632 and 634 deposited in cavities 630. Thus, TMVs may be formed having a lower portion with substantially vertical sides (sides of conductive material 610) and an upper portion having tapered sides and/or a conical shape (sides of cavity 630). As discussed previously regarding FIG. 4E this may facilitate the formation of smaller TMVs as well TMVs having smaller pitches, including pitches of less than 0.3 mm.

Figure 7A:
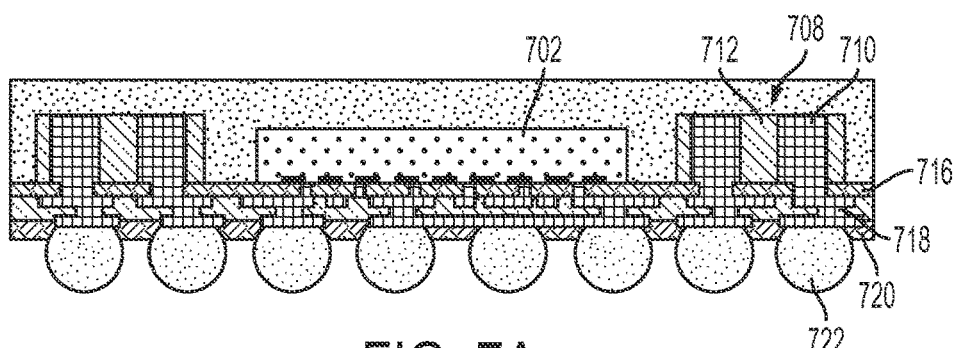
FIGS. 7A-D schematically illustrate cross-section side views of a package assembly during various stages of fabrication including prefabricated via bars, in accordance with some embodiments.

FIGS. 7A-D show another technique for using prefabricated via bars 708 to form TMVs. FIG. 7A is similar to FIG. 6D and may be formed by the operations discussed previously for placing dies and prefabricated via bars. An assembly may include a die 702 and prefabricated via bars 708 at least partially encapsulated in a mold compound. FIG. 7A is different from FIG. 6D, in that the prefabricated via bars 708 have a height that is greater than the thickness of the die 702. The prefabricated via bars 708 may include conductive material 710 and carrier material 712. Other than the difference in height, prefabricated via bars 708 may be substantially similar to prefabricated via bars 608 discussed previously. Additional layers, including RDLs 718, dielectric layer 716 and solder stop 720 may be included and fabricated as discussed previously. Package-level interconnects, such as BGA balls 722 may also be included.

Figure 7B:
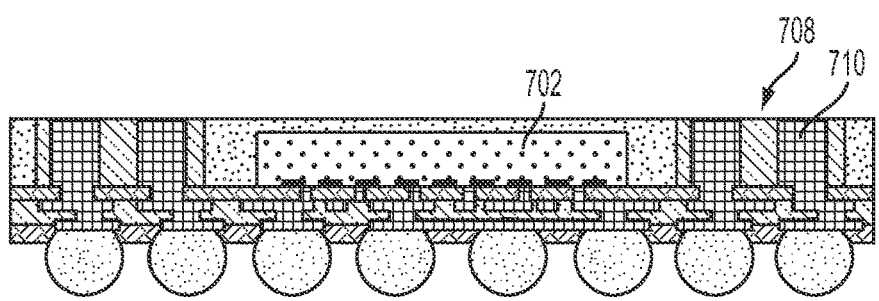

As shown in FIG. 7B material may be removed from the mold compound to expose the upper portion of prefabricated via bars 708. Unlike the previous discussion where the mold compound has been shown as selectively removed, such as by laser drilling, here the mold compound may be removed in a uniform manner by any suitable technique. For instance the top of the mold compound may be subjected to a grinding operation to expose the top of the prefabricated via bars 708.

Figure 7C:
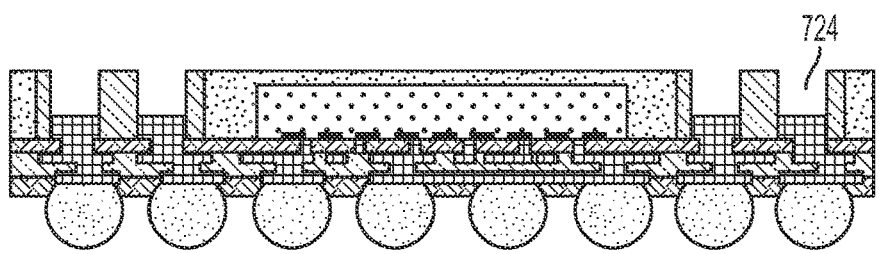

As shown in FIG. 7C a portion of the conductive material 710 may be removed to form a cavity 724. Any suitable operation may be used to remove the conductive material, including an etching process. Cavities 724 may differ from previously discussed cavities (such as cavities 428 and 630) because cavities 724 may have substantially vertical sides. The shape of cavities 724 may be determined based on the construction of the prefabricated via bars 708. As discussed previously, a passivation layer or noble metal layer may be applied to exposed portion of conductive material 710 in order to stabilize the package assembly for storage prior to installation of an additional POP package. The addition of a passivation layer or noble metal layer may provide a package assembly without substantially filling the cavity 724. In such embodiments, cavity 724 may accommodate a POP interconnect structure, such as a BGA ball, protruding from POP package that is to be installed onto the package assembly shown in FIG. 7C.

Figure 7D:
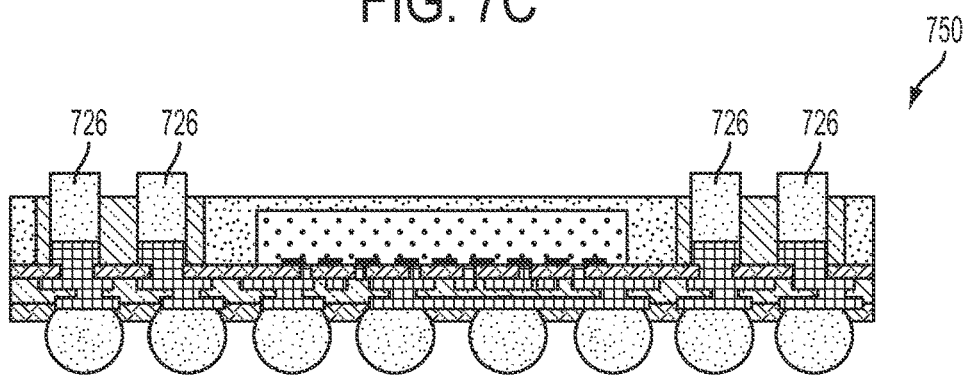

As shown in FIG. 7D additional conductive material 726 may be deposited in the cavities to form an upper portion of a TMV. This may include depositing solder paste or solder balls with flux as discussed previously. While shown as extending above the mold compound it may be possible for the height of conductive material 726 to be equal to or less than the thickness of the mold compound. Additional conductive material 726 may also include or form POP interconnect structures such as a pad (upper surface of 726). Other suitable POP interconnect structures may also be used, including BGA balls. Thus a package assembly 750 may be formed having TMVs with substantially vertical sides. Package assembly 750 may accommodate an additional package via POP interconnects in a similar manner to that discussed above regarding FIGS. 1J and 6G. Utilizing the prefabricated via bars 708 to form the TMVs may provide TMVs with substantially vertical sides. This may facilitate the formation of smaller TMVs as well as TMVs with smaller pitches. This may include POP interconnects having pitches of less than 0.3 mm.

Figure 8:
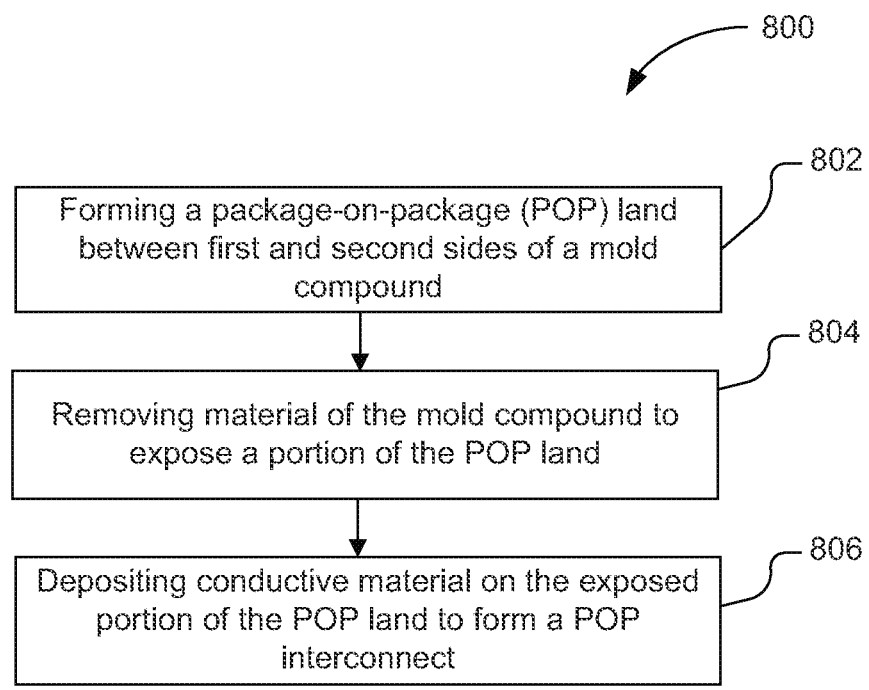
FIG. 8 schematically illustrates a flow diagram of a method of fabricating a package assembly, in accordance with some embodiments.

FIG. 8 schematically illustrates a flow diagram of a method 800 of fabricating a package assembly consistent with the operations discussed above. Only certain operations related to the formation of the TMV are shown, but the method may include additional operations discussed above regarding FIGS. 1-2 to form other structures of the package assembly.

At 802 the method 800 may include forming a POP land between a first and second side of a mold compound. This may include forming a lower portion of a TMV such as 420 in FIG. 4C. This may also include at least partially encapsulating prefabricated via bars (such as prefabricated via bars 608 and 708 of FIGS. 6-7). This may include providing conductive material in a location between the first and second side of the mold compound. The location may be in a region outside of an area defined by a die shadow. Any suitable techniques may be used to carry out this operation as discussed previously.

At 804 the method 800 may include removing material from the mold compound to expose a portion of the POP land. This may include operations discussed previously with regards to FIGS. 4D, 6E, and 7B. For instance, this may include forming cavity 428 in FIG. 4C or forming cavities 630 in FIG. 6E. This may also include uniformly removing mold material as discussed previously regarding FIG. 7B. This operation may be performed by any suitable technique including laser drilling or grinding as discussed previously.

At 806 the method 800 may include depositing conductive material on the exposed portion of the POP land to form a POP interconnect. This may include operations discussed previously with regards to FIGS. 4E, 6F-G, and 7D. This operation may be performed by any suitable technique. Rather than operation 806 as discussed above, it may be useful to apply a passivation layer or a noble metal layer on the exposed portion of the POP land. This may stabilize the package assembly for storage prior to installation of an additional POP package. Thus a gap may remain in the mold compound to later accommodate a POP interconnect of an additional package.

Figure 9:
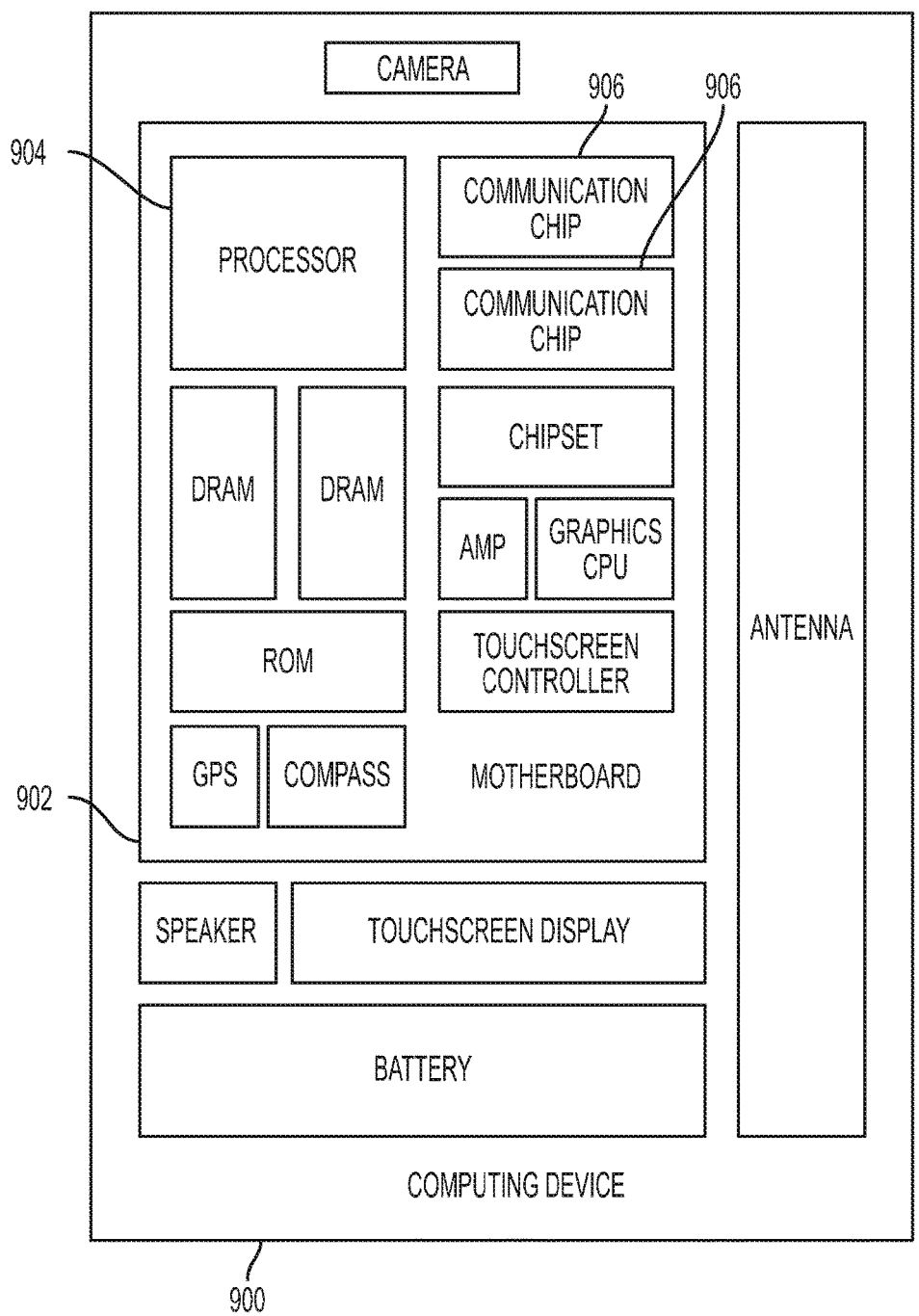
FIG. 9 schematically illustrates a computing device that includes a package assembly as described herein, in accordance with some embodiments.

Embodiments of the present disclosure may be implemented into a system using any suitable hardware and/or software to configure as desired. FIG. 9 schematically illustrates a computing device 900 that includes a package assembly (e.g., one or more of package assemblies 150, 450, 650 or 750 of FIGS. 1, 4, 6 and 7) as described herein, in accordance with some embodiments. The computing device 900 may include a housing to house a board such as motherboard 902. Motherboard 902 may include a number of components, including but not limited to processor 904 and at least one communication chip 906. Processor 904 may be physically and electrically coupled to motherboard 902. In some implementations, the at least one communication chip 906 may also be physically and electrically coupled to motherboard 902. In further implementations, communication chip 906 may be part of processor 904.

Depending on its applications, computing device 900 may include other components that may or may not be physically and electrically coupled to motherboard 902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 906 may enable wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 906 may operate in accordance with other wireless protocols in other embodiments.

Computing device 900 may include a plurality of communication chips 906. For instance, a first communication chip 906 may be dedicated to shorter range wireless communications such as Wi-Fi and Bluetooth, and a second communication chip 906 may be dedicated to longer range wireless communications such as GPS, EDGE, GPRS, CDMA, WiMAX, LTE, Ev-DO, and others.

Processor 904 of computing device 900 may be packaged in a package assembly (e.g., one or more of package assemblies 150, 450, 650 or 750 of FIGS. 1, 4, 6 and 7) as described herein. For example, processor 904 may correspond with one of dies 102, 302, 402, 602 or 702. In some embodiments, processor 904 may include an Atom® processor or Quark® processor manufactured by Intel®. The package assembly (e.g., one or more of package assemblies 150, 450, 650 or 750 of FIGS. 1, 4, 6 and 7) and motherboard 902 may be coupled together using package-level interconnects such as BGA balls (e.g., 114 of FIG. 1). The term "processor" may refer to any device or portion of a device that processes electronic data from registers and/or memory to transform that electronic data into other electronic data that may be stored in registers and/or memory.

Communication chip 906 may also include a die (e.g., dies 102, 302, 402, 602, or 702 of FIG. 1, 3, 4, 6, or 7) that may be packaged in an IC assembly (e.g., one or more of package assemblies 150, 450, 650 or 750 of FIGS. 1, 4, 6 and 7) as described herein. In further implementations, another component (e.g., memory device or other integrated circuit device) housed within computing device 900 may include a die that may be packaged in a package assembly (e.g., one or more of package assemblies 150, 450, 650 or 750 of FIGS. 1, 4, 6 and 7) as described herein.

In various implementations, computing device 900 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Examples

Some non-limiting examples are provided below.

Example 1 includes a method of fabricating a package assembly, the method comprising: forming a package-on-package (POP) land in a region between a first side of a mold compound and a second side of the mold compound disposed opposite to the first side; removing material of the mold compound to expose a portion of the POP land in the region between the first and second sides of the mold compound; and depositing at least one of a conductive material, a passivation layer, or a noble metal on the exposed portion of the POP land.

Example 2 includes the method of example 1, wherein: forming the POP land includes laser drilling from a first side of the mold compound to form a cavity; and depositing a conductive material to substantially fill the cavity.

Example 3 includes the method of example 2, wherein: depositing the conductive material to substantially fill the cavity includes depositing conductive material onto at least one contact of a die.

Example 4 includes the method of example 1, wherein: forming the POP land includes at least partially embedding a prefabricated via bar in the mold compound.

Example 5 includes the method of example 4, wherein: the prefabricated via bar extends across a plurality of package assemblies and the method further comprises separating a first package assembly from a second package assembly.

Example 6 includes the method of example 4, wherein: the prefabricated via bar has a first side proximal to the first side of the mold compound and a second side disposed opposite to the first side, and a die at least partially embedded in the mold compound has a first side proximal to the first side of the mold compound and second side disposed opposite to the first side; and wherein a distance between the second side of the prefabricated via bar and the second side of the mold compound is less than or equal to a distance between the second side of the die and the second side of the mold compound; and removing material of the mold compound to expose a portion of the POP land includes uniformly removing material from the second side of the mold compound to expose a portion of the via bar.

Example 7 includes the method of any of examples 1-5, wherein: depositing at least one of a conductive material, a passivation layer, or a noble metal on the exposed portion of the POP land includes depositing conductive material on a plurality of exposed POP lands to form a plurality of POP interconnects having a pitch of less than 0.3 mm.

Example 8 includes the method of any of examples 1-5, wherein: removing the material of the mold compound comprises laser drilling from the second side of the mold compound.

Example 9 includes a package assembly comprising: a die at least partially embedded in a mold compound; and a through mold via (TMV) having one of: substantially vertical sides; or a first portion, extending from a second side of the mold compound to a location between the second side of the mold compound and a first side of the mold compound disposed opposite to the second side, in which the spacing between the sides of the TMV decreases in a direction from the second side of the mold compound to the location between the first and second sides of the mold compound, and a second portion, extending from the location between the first and second sides of the mold compound to the first side of the mold compound, in which the relationship between the side of the TMV is different from the relationship between the sides of the TMV in the first portion.

Example 10 includes the package assembly of example 9, wherein: the spacing between the sides of the TMV in the second portion increases in a direction from the location between the first and second sides of the mold compound to the first side of the mold compound.

Example 11 includes the package assembly of example 9, wherein: the spacing between the sides of the TMV in the second portion is substantially constant in a direction from the location between the first and second sides of the mold compound to the first side of the mold compound.

Example 12 includes the package assembly of any of example 9, further comprising at least one prefabricated via bar at least partially embedded in the mold compound.

Example 13 includes the package assembly of example 12, wherein: the at least one prefabricated via bar defines at least a portion of the TMV having substantially vertical sides.

Example 14 includes the package assembly of any of examples 9-13, wherein: the TMV is a plurality of TMVs having a pitch of less than 0.3 mm.

Example 15 includes a method of fabricating a package assembly, the method comprising: forming a cavity in a first side of a mold compound outside of a region defined by a die shadow; depositing a conductive material to form a through mold via (TMV) stop by substantially filling the cavity; removing material from a second side of the mold compound to expose the TMV stop; and depositing at least one of a conductive material, a passivation layer, or a noble metal on the TMV stop.

Example 16 includes the method of example 15, further comprising: forming at least one cavity in a dielectric layer to expose the cavity in a first side of a mold compound outside of a region defined by a die shadow and forming at least one additional cavity in the dielectric layer to expose a die contact.

Example 17 includes the method of example 16, wherein: depositing the conductive material to form the TMV stop further includes depositing material to form a die interconnect by substantially filling the at least one additional cavity.

Example 18 includes the method of any of examples 15-17, wherein: forming the cavity in the first side of the mold compound outside of the region defined by the die shadow comprises forming a raised portion on a mold carrier prior to applying the mold compound.

Example 19 includes the method of any of examples 15-17, wherein: forming the cavity in the first side of the mold compound outside of the region defined by the die shadow comprises laser drilling from a first side of the mold compound to form the cavity.

Example 20 includes the method of any of examples 15-17, wherein: forming the cavity in the first side of the mold compound outside of the region defined by the die shadow includes forming a plurality of cavities outside of the region defined by the die shadow such that adjacent cavities define a pitch of less than 0.3 mm.

Example 21 includes a computing device comprising: a circuit board; and a package assembly coupled with the circuit board, the package assembly including a die at least partially embedded in a mold compound; and a through mold via (TMV) having one of: substantially vertical sides; or a first portion, extending from a second side of the mold compound to a location between the second side of the mold compound and a first side of the mold compound disposed opposite to the second side, in which the spacing between the sides of the TMV decreases in a direction from the second side of the mold compound to the location between the first and second sides of the mold compound, and a second portion, extending from the location between the first and second sides of the mold compound to the first side of the mold compound, in which the relationship between the side of the TMV is different from the relationship between the sides of the TMV in the first portion.

Example 22 includes the computing device of example 21, wherein the spacing between the sides of the TMV in the second portion either increases or remains constant in a direction from the location between the first and second sides of the mold compound to the first side of the mold compound.

Example 23 includes the computing device of example 21, wherein the package assembly is a first package assembly and the computing device further comprises a second package assembly having a first side and a second side disposed opposite to the first side, the first side being coupled with the first package assembly using one or more package-level interconnects disposed on the first side; wherein the second package assembly is electrically coupled to the circuit board by the TMV.

Example 24 includes the computing device of any of examples 21-23, wherein: the TMV is a plurality of TMVs having a pitch of less than 0.3 mm.

Example 25 includes the computing device of any of examples 21-23, wherein: the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of fabricating a package assembly, the method comprising:
   forming a package-on-package (POP) land by partially embedding a prefabricated via bar in a region on a first side of a mold compound and extended to a location between the first side of the mold compound and a second side of the mold compound disposed opposite to the first side, wherein the prefabricated via bar extends across a plurality of package assemblies including a first package assembly and a second package assembly separated from the first package assembly, and wherein a die is at least partially embedded in the mold compound and has an active side proximal to the first side of the mold compound;
   removing material of the mold compound to expose a portion of the POP land in a region on the second side of the mold compound after the forming of the POP land; and
   depositing at least one of a conductive material, a passivation layer, or a noble metal on the exposed portion of the POP land.

2. The method of claim 1, wherein:
   forming the POP land includes laser drilling from the first side of the mold compound to form a cavity; and
   depositing a conductive material to substantially fill the cavity.

3. The method of claim 2, wherein:
   depositing the conductive material to substantially fill the cavity includes depositing conductive material onto at least one contact of the die.

4. The method of claim 1, wherein:
   the prefabricated via bar has a first side proximal to the first side of the mold compound and a second side disposed opposite to the first side; and
   wherein a distance between the second side of the prefabricated via bar and the second side of the mold compound is less than or equal to a distance between the second side of the die and the second side of the mold compound; and
   removing material of the mold compound to expose the portion of the POP land includes uniformly removing material from the second side of the mold compound to expose a portion of the via bar.

5. The method of claim 1, wherein:
   depositing conductive material on the exposed POP land includes depositing conductive material on a plurality of exposed POP lands to form a plurality of POP interconnects having a pitch of less than 0.3 mm.

6. The method of claim 1, wherein:
   removing the material of the mold compound comprises laser drilling from the second side of the mold compound.

7. A package assembly comprising:
   a die at least partially embedded in a mold compound with an active side proximal to a first side of the mold compound; and
   a through mold via (TMV) within a cavity through the mold compound having
   a first portion including a prefabricated via bar, extending from a second side of the mold compound to a location between the second side of the mold compound and the first side of the mold compound disposed opposite to the second side, in which a spacing between sides of the TMV decreases in a direction from the second side of the mold compound to the location between the first and second sides of the mold compound, wherein the prefabricated via bar extends across a plurality of package assemblies including a first package assembly and a second package assembly separated from the first package assembly, and
   a second portion below the first portion along a direction from the second side of the mold compound to the first side of the mold compound, extending from the location between the first and second sides of the mold compound to the first side of the mold compound, in which a relationship between the sides of the TMV in the second portion is different from a relationship between the sides of the TMV in the first portion.

8. The package assembly of claim 7, wherein:
   a spacing between the sides of the TMV in the second portion increases in a direction from the location between the first and second sides of the mold compound to the first side of the mold compound.

9. The package assembly of claim 7, wherein:
   a spacing between the sides of the TMV in the second portion is substantially constant in a direction from the location between the first and second sides of the mold compound to the first side of the mold compound.

10. The package assembly of claim 7, further comprising at least one prefabricated via bar at least partially embedded in the mold compound.

11. The package assembly of claim 10, wherein:
    the at least one prefabricated via bar defines at least a portion of the TMV having substantially vertical sides.

12. The package assembly of claim 7, wherein:
    the TMV is one of a plurality of TMVs having a pitch of less than 0.3 mm.

13. A method of fabricating a package assembly, the method comprising:
    forming a cavity in a first side of a mold compound outside of a region defined by a die shadow, including forming a raised portion on a mold carrier prior to applying the mold compound, wherein the cavity extends to a location between the first side of the mold compound and a second side of the mold compound disposed opposite to the first side, and the die is at least partially embedded in the mold compound and has an active side proximal to the first side of the mold compound;

depositing a conductive material to form a through mold via (TMV) stop by substantially filling the cavity;

removing material from the second side of the mold compound to expose the TMV stop;

depositing at least one of a conductive material, a passivation layer, or a noble metal on the TMV stop; and forming at least one cavity in a dielectric layer to expose the cavity in the first side of the mold compound outside of the region defined by the die shadow and forming at least one additional cavity in the dielectric layer to expose a die contact.

14. The method of claim 13, wherein:

depositing the conductive material to form the TMV stop further includes depositing material to form a die interconnect by substantially filling the at least one additional cavity.

15. The method of claim 13, wherein:

forming the cavity in the first side of the mold compound outside of the region defined by the die shadow includes forming a plurality of cavities outside of the region defined by the die shadow such that adjacent cavities define a pitch of less than 0.3 mm.

16. A computing device comprising:

a circuit board; and a package assembly coupled with the circuit board, the package assembly including a die at least partially embedded in a mold compound with an active side proximal to a first side of the mold compound; and a through mold via (TMV) within a cavity through the mold compound having a first portion of the TMV including a prefabricated via bar, extending from a second side of the mold compound to a location between the second side of the mold compound and the first side of the mold compound disposed opposite to the second side, in which a spacing between the sides of the TMV decreases in a direction from the second side of the mold compound to the location between the first and second sides of the mold compound, wherein the prefabricated via bar extends across a plurality of package assemblies including a first package assembly and a second package assembly separated from the first package assembly, and a second portion of the TMV below the first portion of the TMV along a direction from the second side of the mold compound to the first side of the mold compound, extending from the location between the first and second sides of the mold compound to the first side of the mold compound, in which a relationship between the sides of the TMV in the second portion of the TMV is different from a relationship between the sides of the TMV in the first portion of the TMV.

17. The computing device of claim 16, wherein a spacing between the sides of the TMV in the second portion either increases or remains constant in a direction from the location between the first and second sides of the mold compound to the first side of the mold compound.

18. The computing device of claim 16, wherein the package assembly is a first package assembly and the computing device further comprises a second package assembly having a first side and a second side disposed opposite to the first side, the first side being coupled with the first package assembly using one or more package-level interconnects disposed on the first side;

wherein the second package assembly is electrically coupled to the circuit board by the TMV.

19. The computing device of claim 16, wherein:

the TMV is one of a plurality of TMVs having a pitch of less than 0.3 mm.

20. The computing device of claim 16, wherein:

the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *